United States Patent
Chen et al.

(10) Patent No.: US 9,112,507 B2
(45) Date of Patent: Aug. 18, 2015

(54) PHASE-LOCKED LOOP START UP CIRCUIT

(75) Inventors: Chien-Hung Chen, Taipei (TW);
Mao-Hsuan Chou, Jhubei (TW);
Tsung-Hsien Tsai, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 794 days.

(21) Appl. No.: 12/719,951

(22) Filed: Mar. 9, 2010

(65) Prior Publication Data
US 2011/0221494 A1    Sep. 15, 2011

(51) Int. Cl.
*H03L 7/00*    (2006.01)
*H03L 7/06*    (2006.01)
*H03L 3/00*    (2006.01)
*H03L 7/10*    (2006.01)

(52) U.S. Cl.
CPC . *H03L 3/00* (2013.01); *H03L 7/101* (2013.01)

(58) Field of Classification Search
CPC ................................. H03L 7/10; H03L 7/101
USPC ................ 327/141, 144, 147–150, 156–159;
375/373–376; 331/16, 17
See application file for complete search history.

(56) References Cited

U.S. PATENT DOCUMENTS

| 6,407,600 B1 * | 6/2002 | Lu et al. ........................ 327/156 |
| 6,885,252 B2 * | 4/2005 | Hsu ................................. 331/17 |
| 7,786,771 B2 | 8/2010 | Tsai et al. |
| 2003/0007585 A1 | 1/2003 | Dalton et al. |
| 2004/0251970 A1 | 12/2004 | Fayneh et al. |
| 2007/0041486 A1 | 2/2007 | Shin |
| 2010/0141346 A1 | 6/2010 | Chen et al. |

FOREIGN PATENT DOCUMENTS

CN    101594142 A    12/2009

OTHER PUBLICATIONS

Official Action issued Jul. 23, 2012 in counterpart Chinese patent application No. 201010262790.2.

* cited by examiner

*Primary Examiner* — Lincoln Donovan
*Assistant Examiner* — Colleen O Toole
(74) *Attorney, Agent, or Firm* — Duane Morris LLP

(57) ABSTRACT

A phase-locked loop (PLL) circuit includes a voltage-controlled oscillator (VCO) having a VCO input for receiving a control voltage and a VCO output, a feedback loop between the VCO input and the VCO output, and a start-up circuit having a start-up circuit input and a start-up circuit output. The start-up circuit output is coupled to the VCO input and the start-up circuit input is coupled to the VCO output. The start-up circuit provides a voltage at its start-up circuit output during a start-up phase, which terminates after a predetermined number of feedback pulses are detected by the start-up circuit.

20 Claims, 4 Drawing Sheets

Minimum Fout requirement = 600MHz

| VCOIN (V) | Frequency (MHz) | Process | Voltage (V) | Temp (°C) |
|---|---|---|---|---|
| 1.635 | 262 | TT | 2.50 | 25 |
| 1.415 | 159 | TT | 2.25 | -40 |
| 1.493 | 198 | TT | 2.25 | 125 |
| 1.796 | 390 | TT | 2.75 | -40 |
| 1.868 | 361 | TT | 2.75 | 125 |
| 1.391 | 105 | SS | 2.25 | -40 |
| 1.470 | 147 | SS | 2.25 | 125 |
| 1.771 | 299 | SS | 2.75 | -40 |
| 1.843 | 286 | SS | 2.75 | 125 |
| 1.441 | 231 | FF | 2.25 | -40 |
| 1.518 | 264 | FF | 2.25 | 125 |
| 1.823 | 503 | FF | 2.75 | -40 |
| 1.896 | 450 | FF | 2.75 | 125 |

← Final VCOIN Voltage

Fig. 6

PHASE-LOCKED LOOP START UP CIRCUIT

FIELD OF THE INVENTION

The present disclosure relates generally to circuits, and more particularly to phase-locked loop circuits utilizing start-up circuits.

BACKGROUND OF THE INVENTION

Phase-locked loop (PLL) circuits are widely used in integrated circuit designs, such as in the design of receivers. PLL circuits are basically closed-loop frequency control systems whose operation is based on the phase sensitive detection of the phase difference between an input signal and an output signal.

FIG. 1 illustrates a conventional PLL circuit, which includes phase frequency detector (PFD) 20, charge pump 22, low-pass loop filter 24, voltage-controlled oscillator (VCO) 26, feedback (FB) divider 28, and start-up circuit 32. Input signal S_in having an input frequency F_in is input into the PLL circuit and an output signal S_out having an output frequency F_out is generated by the PLL.

A schematic diagram of start-up circuit 32 is shown in FIG. 2. Start-up circuit 32 includes cycle counter 34, which counts the cycles of the input signal S_in and provides a pulling voltage to node 36 in FIG. 1. Starting from the first cycle of the input signal, switches 38 in FIG. 2 are closed and a voltage (VDD) is applied to PMOSs 40 so that the divided voltage (e.g., VDD/2) is output to node 36 in FIG. 1. This output voltage is designated VPULL. Accordingly, loop filter 24, which includes capacitors, is charged and the voltage VCOIN at node 36 increases due to the charging of the capacitors. The frequency F_vco of the signal S_vco outputted by VCO 26 thus increases with increase in the voltage VCOIN.

Cycle counter 34 and the entire start-up circuit 32 are turned off after a certain number of cycles, for example, 64 cycles of the input signal S_in. At this time, the frequency F_vco of signal S_vco is at an initial frequency. It is realized that this initial frequency is affected by several factors. For example, for a 50 MHz input signal, start-up circuit 32 is turned on for 1.28 microseconds. However, when the input signal has a frequency of 10 MHz, start-up circuit 32 is turned on for 6.4 microseconds. Such a significant difference in the frequencies of the input signals causes different lock times for PLL circuits. For example, the time that the start-up circuit 32 is on may be 1.28 microseconds or 6.4 microseconds, in these examples, leading to different lock-times for the PLL circuit.

Further, by the time that start-up circuit 32 is turned off, the initial frequency F_vco of signal S_vco may have already exceeded the target frequency specified by the specification. Such a high frequency is out-of-spec and cannot be sent out of the PLL circuit before it is decreased. Referring again to FIG. 1, gating circuit 30 (e.g., a NOR gate) is added to gate the initial frequency. Gating circuit 30 blocks the signal generated by VCO 26 from being sent out of the PLL circuit until the frequency is reduced to a target frequency. To achieve such a function, gating circuit 30 needs to compare the signal generated by VCO 26 with a reference signal having the target frequency. However, due to the potential phase difference between the signal generated by VCO 26 and the reference signal, gating circuit 30 may output glitches that have much narrower pulses than required.

An additional problem with the conventional PLL circuit is caused by process, voltage, and temperature (PVT) variations, which cause different PLL circuits, although having a same design, to work on different process corners, such as fast-fast (FF) corner, slow-slow (SS) corner, and the like. Even for a same input signal, the initial frequencies of circuits working at the FF corner may have exceeded the target operating frequency, while the initial frequencies of the circuits working at the SS corner still have frequencies well below the target operating frequency. To ensure that the target operating frequency is not exceeded, the design of the PLL circuits may be adjusted so that the initial frequencies of the circuits working at the FF corner are also below the target operating frequency. Unfortunately, this may cause the circuits working at the SS corner to fail to start oscillating.

Per the foregoing discussion, the conventional PLL circuits have subtle problems that are difficult to overcome. New PLL circuits and new start-up circuits are thus desired.

SUMMARY OF THE INVENTION

In accordance with one or more embodiments, a phase-locked loop (PLL) circuit includes a voltage-controlled oscillator (VCO) having a VCO input for receiving a control voltage and a VCO output, a feedback loop between the VCO input and the VCO output, and a start-up circuit having a start-up circuit input and a start-up circuit output. The start-up circuit output is coupled to the VCO input and the start-up circuit input is coupled to the VCO output. The start-up circuit provides a voltage at its start-up circuit output during a start-up phase, which terminates after a predetermined number of feedback pulses are detected by the start-up circuit The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate one or more preferred embodiments of the invention, as well as other information pertinent to the disclosure, in which:

FIG. 6 is a table showing simulation results of the operations of the PLL circuit of FIG. 3 under different process variations and operating conditions.

DETAILED DESCRIPTION

This description of the exemplary embodiments is intended to be read in connection with the accompanying drawings, which are to be considered part of the entire written description. Relative terms are used for convenience of description and do not require that the apparatus be constructed or operated in a particular orientation. Terms concerning electrical communications and the like, such as, "coupled" and "electrically coupled" or "electrically connected," refer to a relationship wherein nodes communicate with one another either directly or indirectly through intervening structures or elements, unless described otherwise.

Figure 3:
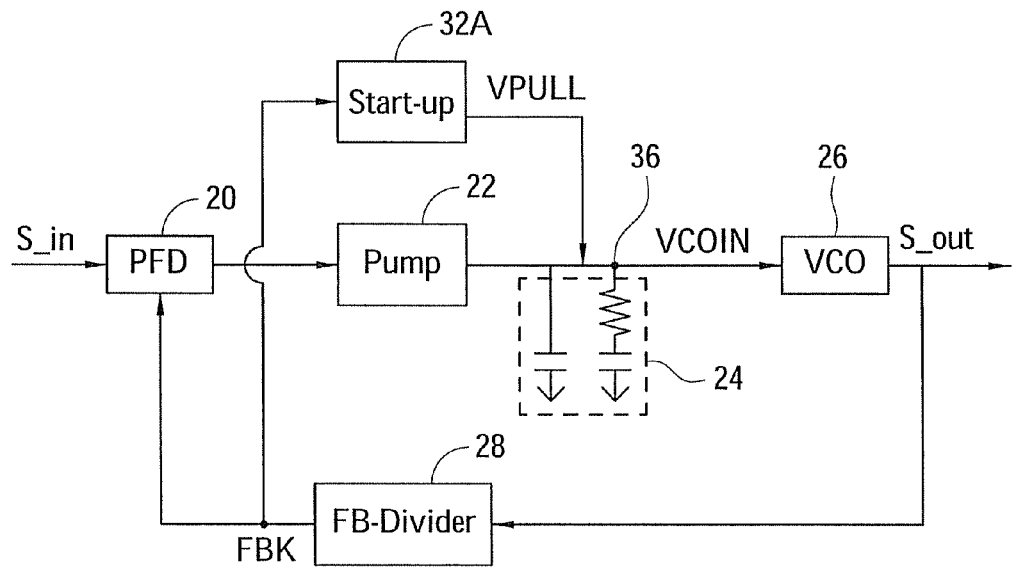
FIG. 3 illustrates a phase-locked loop (PLL) circuit according to an embodiment of the present invention.

FIG. 3 illustrates an embodiment of a charge pumped phase-locked loop circuit according to an embodiment of the present invention. In the illustrated embodiment, the PLL circuit includes a phase frequency detector (PFD) 20, charge pump 22, low-pass loop filter 24, voltage-controlled oscillator (VCO) 26, a feedback (FB) divider 28, and a start-up circuit 32A. Input signal S_in has an input frequency F_in and is inputted into the PLL circuit. An output signal S_out having an output frequency F_out is generated by the PLL.

In exemplary embodiments, the target frequency for the output signal S_out is between about 500 MHz to 1000 MHz. In such embodiments, the frequency of the input signal S_in may be between about 10 MHz to 50 MHz.

Figure 1:
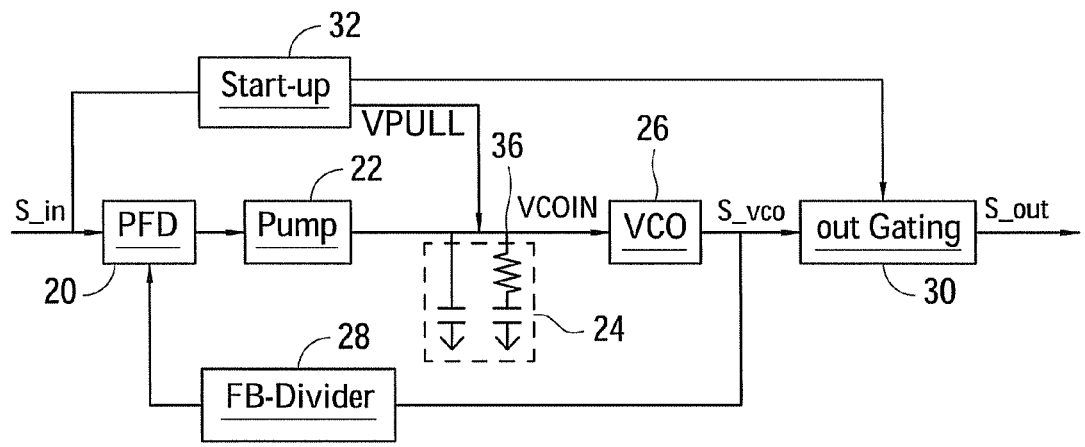
FIG. 1 illustrates a conventional phase-locked loop (PLL) circuit including a start-up circuit and a gating circuit.
Figure 4:
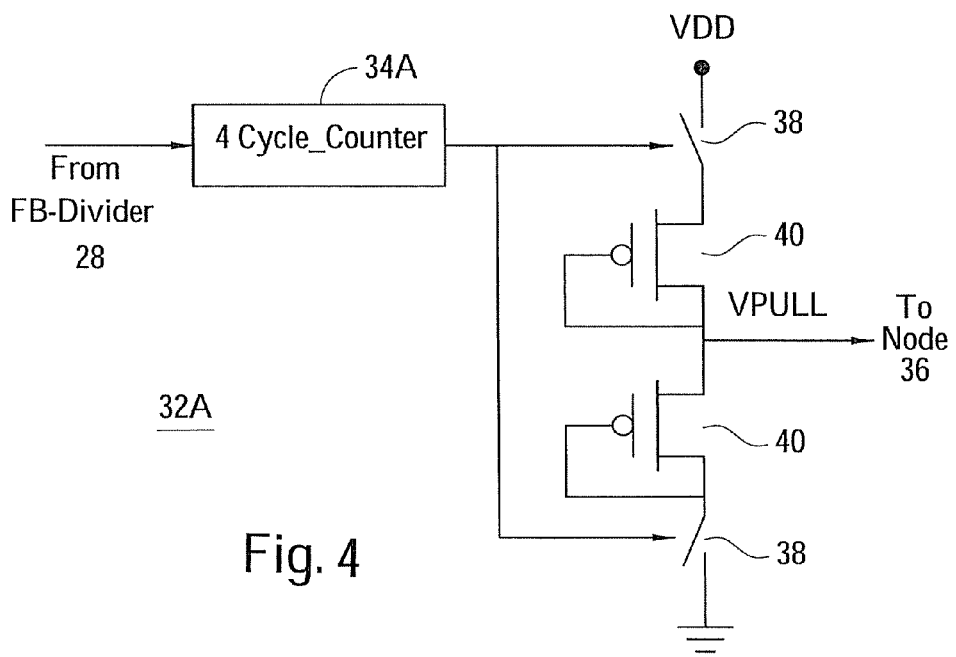
FIG. 4 illustrates an embodiment of a start-up circuit for use in the PLL circuit of FIG. 3.

A schematic diagram of the start-up circuit 32A is shown in FIG. 4. The start-up circuit 32A is identical to start-up circuit 32 except in two respects. First, the input to the start-up circuit is coupled to the output of the FB divider 28. Second, the start-up circuit includes a detector for detecting feedback pulses from the output signal_out. For example, the start-up circuit includes cycle counter 34A that counts the cycles of the output signal S_out rather than those of the input signal S_in. For reasons discussed in more detail below, the cycle counter 34A can be set to count fewer cycles before discontinuing the charging voltage when compared to the cycle counter 34 of prior art FIG. 1.

During operation, the start-up circuit 32A outputs a pulling voltage VPULL at a selected voltage level, for example, VDD/2. This pulling voltage is provided to node 36 to charge the capacitors of the loop filter 24. As the capacitors charge, the VCO control voltage (VCOIN) at node 36 rises towards the pulling voltage level. As the voltage VCOIN at node 36 rises, the output frequency of S_out rises. In the embodiment illustrated in FIG. 4, the start-up circuit 34A turns off when cycle counter 34A detects the fourth rising edge of the feedback signal FBK. It may be that VCOIN has not reached VDD/2 when this fourth rising edge is detected.

In the illustrated embodiment, the feedback signal FBK for the start-up circuit 32A comes from the FB-divider 28 rather than from the VCO 26 (i.e., signal S_out) but it is contemplated that the feedback signal may be taken directly from the output of the VCO into the cycle counter 34A. However, in that embodiment, the time may not be enough to charge VCOIN to a sufficient level to guarantee that the VCO enters the desired operation region unless the 4 cycle-counter was replaced with a cycle-counter of much higher count. For example, assume that the value of FB-Divider 28 (NF) is 100, and the required frequency of S_out to guarantee that the VCO enters the desired operation region is 100 MHz. In this example, if the input signal of the counter 34A is S_out, the charging time for VCOIN would only be 0.04 μs, which would likely not be enough to charge VCOIN to 0.5 V for example. However, if the input signal of counter is FBK, the time to charge VCOIN would be 4 μs, which would be enough time to charge VCOIN to 0.5V, for example. Essentially, the illustrated embodiment borrows the operation of the FB-divider 28 to generate more timing margin for charging VCOIN, while allowing for a simplified design of the cycle counter 34a.

Figure 2:
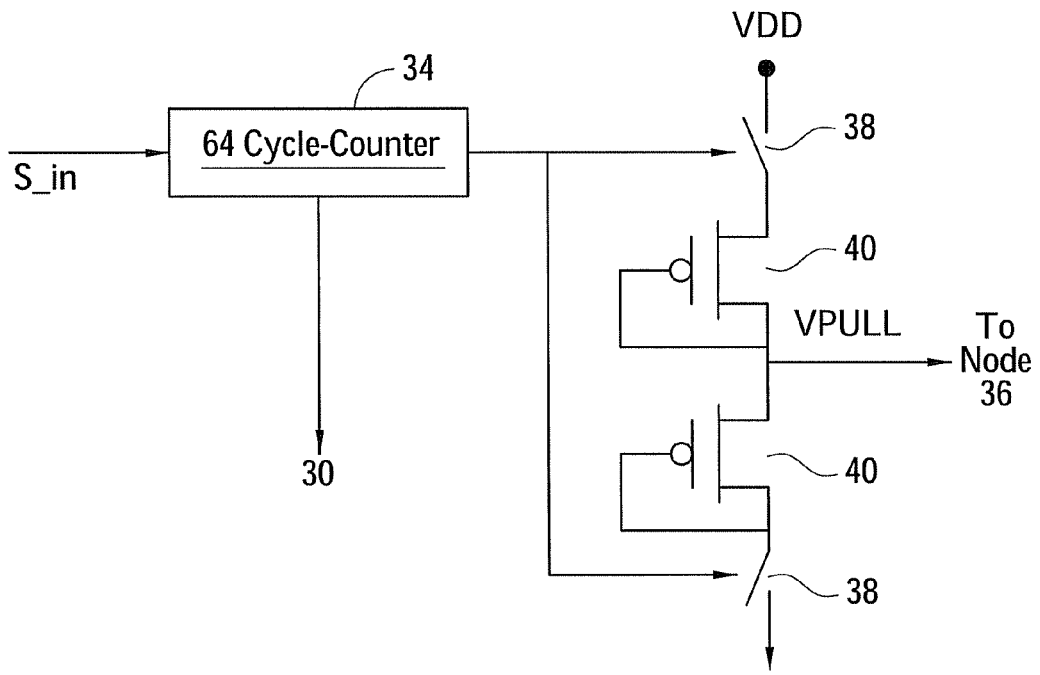
FIG. 2 illustrates the start-up circuit as shown in FIG. 1, wherein the start-up circuit includes a cycles counter.

The start-up circuit design 32A is suitable for any charge pump PLL circuit and can be easily implemented. The use of PLL start-up circuit 32A also provides several advantages over the conventional start-up circuit configuration 32 of FIGS. 1 and 2. Because the start-up circuit 32A is controlled by a feedback signal from the VCO 26, the start-up circuit can be made to turn off when the PLL becomes operational (i.e., oscillates) as opposed to after some minimum cycle count of the input signal S_in. This approach can reduce the lock time for the PLL circuit. Moreover, controlling the start-up circuit 32A with the feedback loop can ensure not only that the start-up circuit operates long enough for the PLL circuit to begin oscillating but also that start-up circuit 32A does not operated too long. That is, the start-up circuit 32A ensures that the VCO start-up oscillating frequency is lower than the target VCO frequency. Since the pulling frequency will not be more than the target specified operating frequency, there is no risk of the PLL circuit outputting an undesired initial frequency. As such, the PLL output gating function shown in FIG. 1, which is subject to the glitches discussed above, is not required.

Because the cycle counter 34A of the start-up circuit 32A counts cycles of the feedback signal FBK and not those of the input signal S_in, the operating time of the start-up circuit 32A of the PLL circuit of FIG. 3 is completely independent of the input frequency of the input signal S_in. This independence can be seen in FIG. 4. As such, there are no input clock-induced variations in start-up time. When the start-up time is dependent on the input clock signal S_in, as is the case with the prior art, the start-up time is shorter for higher input frequencies than for lower input frequencies. With such a design, there is a risk when higher input frequencies are used that the start-up function may disable before the VCO circuit 26 begins to oscillate.

The cycle counter 34A may be a binary counter. In exemplary embodiments, the cycle counter 34A is a 4-cycle counter, which can be implemented as a 2-bit counter. While a 4-cycle counter 34A is shown in FIG. 4, it should be understood that in embodiments, the counter could be an 8-cycle (3-bit), or other cycle counter. The appropriate number of cycles can be determined by modeling the PLL circuit.

Figure 5:
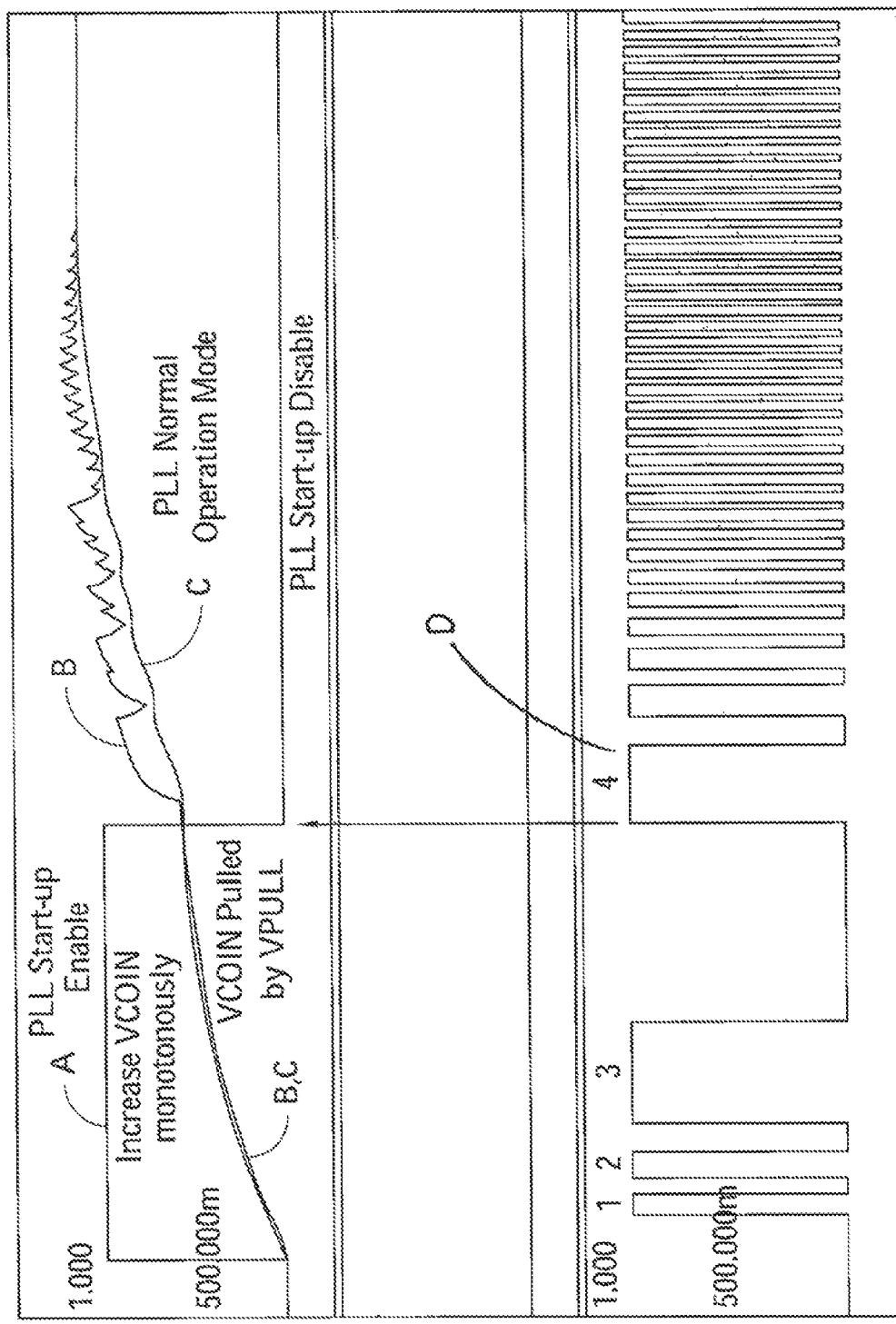
FIG. 5 is a screen shot of a simulation illustrating the operation of the PLL circuit of FIG. 3.

FIG. 5 is a screen print of a simulation of the PLL circuit of FIG. 3. Signal A represents the length of time that the start-up circuit 34A is on and providing its output pulling voltage (VPULL). Signal B represents the control voltage VCOIN at the input of the VCO 26. Signal C represents the voltage at the node between the resistor and capacitor in the second leg of the filter 24. The signal C was plotted only for internal design reference and is not of consequence for purposes of illustrating the invention. Finally, signal D represents the feedback signal FBK. As can be seen from FIG. 5, specifically Signal A thereof, the start-up circuit 32A turns off at the rising edge of the fourth cycle of the feedback signal (Signal D). During this start-up phase, the control voltage VCOIN rises generally linearly or monotonously from 0V as it is pulled upward by the pulling voltage VPULL from the start-up circuit 32A. When VCOIN is larger than the threshold voltage (Vth) of the VCO, the VCO 26 will oscillate. Thereafter, i.e., 4 cycles into the oscillation, the start-up circuit 34A turns off and the control voltage VCOIN varies until the steady state is reached.

FIG. 6 is a table showing results of a simulation for the PLL circuit of FIG. 3 where the simulation assumed different process variations/corners, e.g., typical-typical (TT), fast-fast (FF) and slow-slow (SS) and operating parameters. The simulation assumed that the specified target oscillating frequency for the PLL circuit was 600 MHz. The column labeled "VCOIN (V)" shows the final voltage of VCOIN at node 36 when the start-up circuit turns off. The column labeled "Frequency (MHz)" shows the output frequency of the VCO output signal when the start-up circuit turns off. The column labeled "Process" shows the assumed process variation for a given simulation (e.g., TT, SS or FF corner). The column labeled "Voltage (V)" represents the supply voltage VDD, e.g., 2.5 V. The circuit should work properly at VDD±10%. Finally, the column labeled "Temp (° C.)" represents the temperature for the given simulation run. The cycle counter was set to 4 in the simulation. The simulated start-up circuit did not turn off prior to oscillation and was not on long enough to exceed the target frequency. As can be seen from the simulation results in the table, VCOIN never reached the pulling voltage and the start-up circuit successfully turned off in each simulation when the VCO circuit was oscillating at a frequency less than the target frequency. The lowest frequency for the VCO output when the start-up circuit turned off was 105 MHz and the highest frequency was 503 MHz, both of which are under the 600 MHz target frequency set forth simulation. The results show that the start-up time can be reduced and confirm that there is no need for the additional gating circuitry of the prior art.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A phase-locked loop (PLL) circuit, comprising:
   a voltage-controlled oscillator (VCO) having a VCO input for receiving a control voltage and a VCO output;
   a feedback loop between the VCO input and the VCO output; and
   a start-up circuit having a start-up circuit input and a start-up circuit output, wherein the start-up circuit output is coupled to the VCO input and wherein the start-up circuit input is coupled to the VCO output,
   wherein the start-up circuit provides a voltage at its start-up circuit output during a start-up phase, which terminates after a predetermined number of feedback pulses are detected by the start-up circuit.

2. The PLL circuit of claim 1, wherein the start-up circuit comprises a cycle counter.

3. The PLL circuit of claim 2, wherein the cycle counter counts feedback pulses received at the start-up circuit input, wherein the start-up circuit provides a start-up voltage at its start-up circuit output during a start-up phase, which terminates after a predetermined number of feedback pulses are detected by the cycle counter.

4. The PLL circuit of claim 3, wherein the predetermined number of feedback pulses is between 2 to 8 feedback pulses.

5. The PLL circuit of claim 3, wherein the predetermined number of feedback pulses is 4 feedback pulses.

6. The PLL circuit of claim 1, wherein the feedback loop comprises a loop filter coupled to the VCO input.

7. The PLL circuit of claim 6, wherein the feedback loop further comprises:
   a phase frequency detector having a first input for receiving a signal having an input frequency, a second input and an output;
   a pump having an input coupled to the output of the phase frequency detector and an output coupled to the loop filter; and
   a feedback divider having an input coupled to the VCO output and an output coupled to the second input of the phase frequency detector.

8. The PLL circuit of claim 7, wherein the output of the feedback divider is coupled to the start-up circuit input.

9. A phase-locked loop (PLL) circuit, comprising:
   a voltage-controlled oscillator (VCO) having a VCO input coupled to a voltage control node and a VCO output;
   a loop filter coupled to the voltage control node;
   a phase frequency detector having a first input for receiving a signal having an input frequency, a second input and an output;
   a pump having an input coupled to the output of the phase frequency detector and an output coupled to the loop filter;
   a feedback divider having an input coupled to the VCO output and an output coupled to the second input of the phase frequency detector; and
   a start-up circuit having a start-up circuit input coupled to the output of the feedback divider and a start-up circuit output coupled to the voltage control node.

10. The PLL circuit of claim 9, wherein the start-up circuit provides a voltage at its start-up circuit output during a start-up phase, which terminates after a predetermined number of feedback pulses are detected by the start-up circuit.

11. The PLL circuit of claim 9, wherein the start-up circuit comprises:
   a cycle counter, wherein the cycle counter counts feedback pulses received at the start-up circuit; and
   a voltage source, said voltage source providing a pulling voltage to the voltage control node during a start-up phase.

12. The PLL circuit of claim 11, wherein the start-up phase terminates after a predetermined number of feedback pulses are detected by the cycle counter.

13. The PLL circuit of claim 12, wherein the predetermined number of feedback pulses is between 2 to 8 feedback pulses.

14. The PLL circuit of claim 12, wherein the predetermined number of feedback pulses is 4 feedback pulses.

15. The PLL circuit of claim 12, wherein the cycle counter is a binary counter.

16. The PLL circuit of claim 12, wherein the predetermined number of feedback pulses is selected so that the start-up phase terminates before a target frequency for the phase-locked loop circuit is reached.

17. The PLL circuit of claim 10, wherein the loop filter comprises at least one capacitor.

18. A phase-locked loop (PLL) circuit, comprising:
   a voltage-controlled oscillator (VCO) having a VCO input coupled to a voltage control node and a VCO output;
   a loop filter coupled to the voltage control node, the loop filter comprising at least one capacitor;
   a phase frequency detector having a first input for receiving a signal having an input frequency, a second input and an output;
   a pump having an input coupled to the output of the phase frequency detector and an output coupled to the loop filter;
   a feedback divider having an input coupled to the VCO output and an output coupled to the second input of the phase frequency detector; and
   a start-up circuit having a start-up circuit input coupled to the output of the feedback divider and a start-up circuit output coupled to the voltage control node, wherein the start-up circuit outputs a pulling voltage for charging the at least one capacitor of the loop filter during a start-up phase,
   wherein the start-up circuit includes a detector for detecting feedback pulses from the phase-frequency detector and terminating the start-up phase after detection of a predetermined number of feedback pulses, and
   wherein the predetermined number of feedback pulses is selected so that the start-up phase terminates before a target frequency for the phase-locked loop circuit is reached.

19. The PLL circuit of claim 18,
   wherein the detector of the start-up circuit comprises a cycle counter, and wherein the start-up circuit comprises a voltage source under control of the cycle counter for providing the pulling voltage during the start-up phase.

20. The PLL circuit of claim 18, wherein the predetermined number of feedback pulses is 4.

* * * * *